United States Patent [19]

Kwansnick et al.

[11] Patent Number: 5,233,181
[45] Date of Patent: Aug. 3, 1993

[54] PHOTOSENSITIVE ELEMENT WITH TWO LAYER PASSIVATION COATING

[75] Inventors: Robert F. Kwansnick; Jack D. Kingsley, both of Schenectady, N.Y.

[73] Assignee: General Electric Company, Schenectady, N.Y.

[21] Appl. No.: 891,117

[22] Filed: Jun. 1, 1992

[51] Int. Cl.$^5$ .............................................. H01J 40/14
[52] U.S. Cl. ................................... 250/208.1; 257/291
[58] Field of Search .......................... 250/208.1, 214.1; 257/290, 291

[56] References Cited

U.S. PATENT DOCUMENTS 4,924,282  5/1990  Komiyama et al. ................ 257/290
5,101,285  3/1992  Kawai et al. ...................... 250/208.1

OTHER PUBLICATIONS

"Amorphous Silicon Image Sensor Array". M. J. Powell et al., Abstracts of Materials Research Society Meeting Apr. 27, 1992, Philips Research Laboratories, Redhill, Surrey, RH1 5HA, UK.

Primary Examiner—David C. Nelms
Attorney, Agent, or Firm—Donald S. Ingraham; Marvin Snyder

[57] ABSTRACT

A photosensitive element has a two tier passivation layer disposed between the top contact layer and the amorphous silicon photosensor island. The passivation layer includes an inorganic moisture barrier layer which is disposed at least over the sidewalls of the photosensor island. The inorganic material forming this layer is preferably silicon nitride or silicon oxide. An organic dielectric layer is disposed over the moisture barrier layer and the photosensor island except for a selected contact area on the top surface of the photosensor island where the top contact layer is in electrical contact with the amorphous silicon material of the photosensor island. The organic dielectric material is preferably a polyimide.

10 Claims, 1 Drawing Sheet

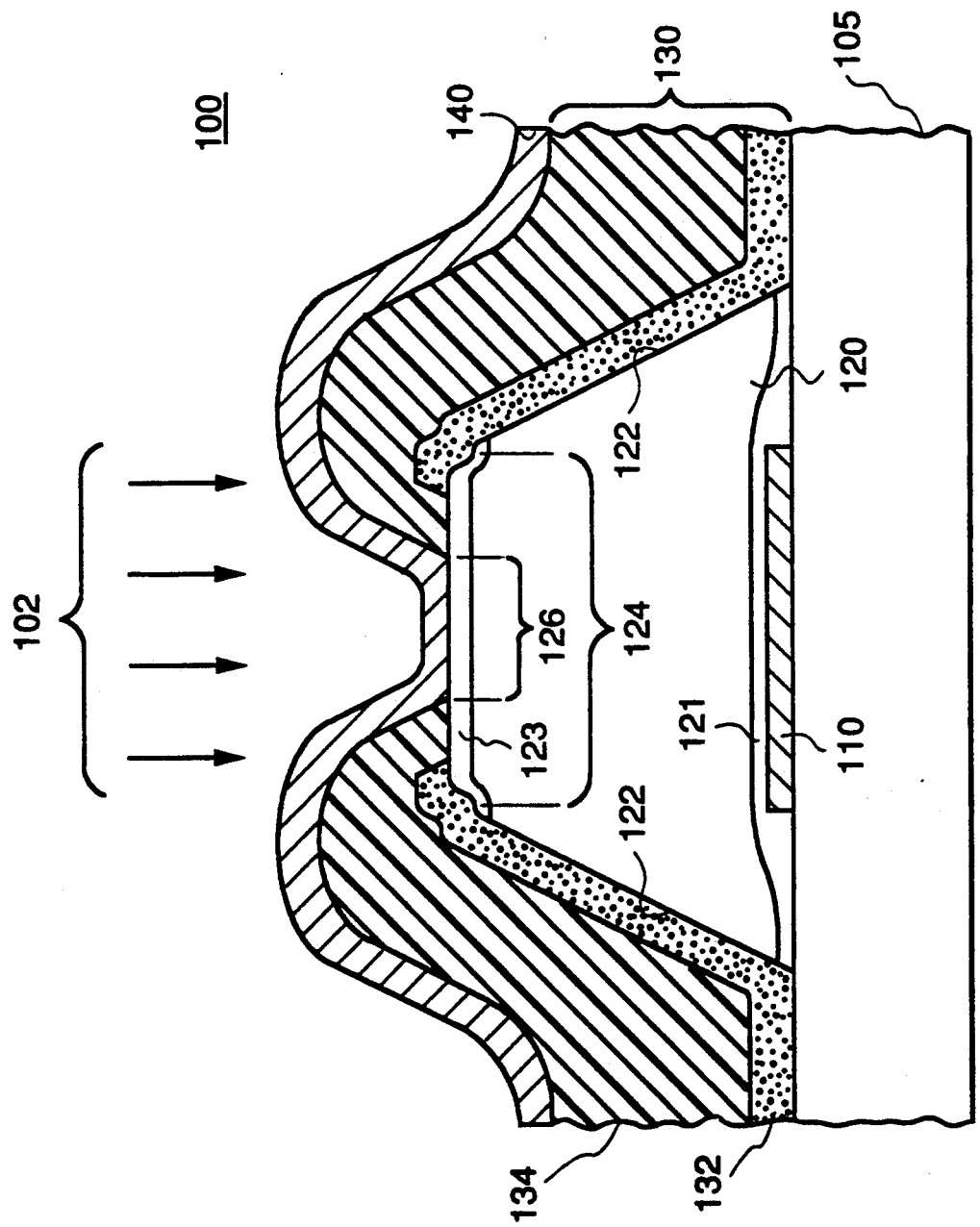

PHOTOSENSITIVE ELEMENT WITH TWO LAYER PASSIVATION COATING

FIELD OF THE INVENTION

This invention relates generally to photosensors and more particularly to passivating layers for reducing leakage from silicon photosensitive elements.

BACKGROUND OF THE INVENTION

Photosensitive elements (for converting incident radiant energy into an electrical signal) are commonly used in imaging applications, for example, x-ray imagers and facsimile devices. Hydrogenated amorphous silicon (a-Si) and alloys of a-Si are commonly used in the fabrication of photosensitive elements due to the advantageous photoelectric characteristics of a-Si and the relative ease of fabrication. In particular, photosensitive elements, such as photodiodes, can be formed in conjunction with necessary control or switching elements, such as thin film transistors (TFT's), in relatively large area arrays.

Photodiodes typically include an island or body of photosensitive material, such as a-Si, disposed between two electrodes electrically coupled to opposite surfaces of the photodiode body. As incident radiation is absorbed in the a-Si, holes and electrons are produced and move toward the upper or lower surface of the photodiode dependent on the electric filed established by the electrodes. The amount of charge collected at the electrodes is a function of the energy flux of the incident light. Periodic measuring of charge collected on a photodiode, and resetting the diode to a known charge condition, is used to process electrical signals generated by the photodiode in response to incident radiation.

Charge leakage is a critical factor in photodiode performance as the loss of charge during a sampling cycle lessens a photodiode's sensitivity and increases the noise. The two significant components of charge leakage are area leakage and sidewall leakage. Particularly in smaller diodes in which the area of the sidewalls is relatively large with respect to the overall area of the photodiode, sidewall leakage constitutes the primary source of leakage, although degradation of sidewall surfaces due to exposure to moisture can make sidewall leakage a significant leakage source in almost any size photodiode. It is thus desirable to cover the photodiode body, and in particular the sidewalls, with a passivating layer to limit this type of charge leakage.

It is desirable that the passivating layer have the following characteristics: First, it should act as an electrically insulating barrier between the upper electrode, the a-Si photodiode body, and other underlying electrically conductive components, such as address lines and TFT's which are used in reading and processing electrical signals generated by the photodiode. Second, the passivating layer should be capable of being selectively etched with respect to the a-Si to enable formation of a non-leaky contact connection between the upper electrode and the upper surface of the photodiode body. Third, the passivating layer should cover the photodiode body without cracking or inducing stresses that adversely affect photodiode performance or the dielectric integrity of the passivating layer. Fourth, the interface between the passivating layer and the sidewalls of the photodiode body should have minimal conductivity so that photodiode leakage in reverse bias is not degraded by the presence of the dielectric. Fifth, the passivating layer should be thick enough (on the order of 1 micron) so that the capacitance between the upper electrode and underlying address lines is kept to a level that allows the signal on the photodiode to be completely read out in the relatively short allowed system sampling time (e.g., about 10 microseconds). Sixth, the passivating layer should be capable of being deposited at temperatures that do not cause significant degradation of the a-Si photodiode properties, e.g., less than about 250° C. Seventh, the passivating layer should desirably protect the photodiode sidewall surfaces from degradation due to humidity, moisture, or chemical attack from materials in the environment or present on the substrate. This latter concern is present both during fabrication and also over time as the device is exposed to a variety of environments.

Passivating layers are commonly made up of one layer of material. Certain polyimides, particularly preimidized polyimides, have been found to provide a satisfactory passivating layer with regard to several of the desirable characteristics listed above. Drawbacks to polyimide passivating layers include constraints of temperature in the formation process relative to the optimal cure temperature for the polyimide, and the poor moisture barrier provided by polyimides. Indeed, most polyimides providing otherwise satisfactory passivating layer characteristics are hygroscopic, that is they tend to absorb moisture from the environment. This characteristic is particularly undesirable in light of the increased leakage resulting from degradation of the photodiode sidewalls in contact with polyimide. Single layer inorganic dielectrics have been used in some situations, but typically such layers cannot be deposited to a sufficient thickness to provide the desired capacitance in the device without experiencing debilitating stresses that affect the structural integrity of the dielectric layer and degrade device performance and longevity.

It is thus an object of this invention to provide a photosensitive element having a passivating layer that provides a high integrity moisture barrier for the sidewalls of the photodiode body.

It is a further object of this invention to provide a passivating layer for a photosensitive element that provides a high integrity dielectric layer that is structurally sound.

It is yet a further object of this invention to provide a passivating layer for a photosensitive element that can be fabricated at temperatures that are consistent with minimal degradation of a-Si photodiode properties.

Another object of this invention is to provide a low sidewall leakage photodiode.

SUMMARY OF THE INVENTION

In accordance with the present invention, a photosensitive element includes a bottom contact pad disposed on a substrate, a photosensor island disposed on the substrate in electrical contact with the bottom contact pad, a passivation layer, and a top contact layer. The photosensor island has sidewalls extending upwardly from the substrate to an upper surface extending between the sidewalls. The top contact layer is in electrical contact with a selected contact area of the upper surface of the photosensor island; elsewhere the passivation layer is disposed between the top contact layer and the underlying photosensor island and substrate. The passivation layer includes an inorganic moisture barrier layer extending at least over the photosensor island sidewalls and an organic dielectric layer.

The inorganic moisture barrier layer is typically comprised of silicon nitride. This moisture barrier layer advantageously extends over the substrate area, the photosensor island sidewalls, and a portion of the upper surface of the photosensor island. The organic dielectric layer typically comprises a polyimide and extends over the inorganic moisture barrier layer and the upper surface of the photosensor island except where the upper contact layer is in electrical contact with the photosensor island. The thickness of the inorganic moisture barrier layer is preferably between about 0.01 and 0.5 microns, and the thickness of the organic dielectric layer is preferably between about 0.5 and 2.5 microns.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

The single FIGURE is a cross-sectional view of a photodiode fabricated in accordance with this invention.

DETAILED DESCRIPTION OF THE INVENTION

As illustrated in the FIGURE, a photosensor element such as a photodiode 100 in accordance with this invention comprises a substrate 105, a bottom contact pad 110, a photosensor island 120, a passivating layer 130, and a top contact layer 140. Photodiode 100 is typically positioned to be exposed to incident radiation 102. In a common arrangement, photodiode 100 is one of a number of photodiodes in an array. For ease of describing the invention, only one photodiode is illustrated, and other elements that may be formed on substrate 105 along with the photodiode, such as address lines (commonly in a matrix arrangement of scan and data lines) and thin film transistors (TFT's) to control switching on these lines between photodiodes are not shown. Alternatively, many photodiodes may be formed on substrate 105 and electrically connected to switches and other processing circuits located off of the substrate.

Bottom contact pad 110 is typically disposed on substrate 105 and is formed of an electrically conductive material that will have good electrical contact with the material of photosensor island 120. Alternatively, bottom contact pad 110 may be disposed on a dielectric layer or other materials (not shown) disposed on the substrate. Typical materials from which bottom contact pad 110 is formed include molybdenum or chromium. Bottom contact pad 110 is connected to switching and processing circuits, which are not illustrated in the FIGURE, that allow charge generated by the photodiode in response to incident radiation to be sampled. Bottom contact pad 110 and top contact layer 140 serve as the electrodes in the photodiode to establish the electric field across the device to allow the charge to be collected.

Photosensor island 120 is disposed on substrate 105 in electrical contact with bottom contact pad 110. Alternatively, photosensor island 120 maybe disposed on a dielectric layer (not shown) that is disposed over the substrate and portion of bottom contact pad 110 such that photosensor island 120 makes electrical contact with the bottom contact pad through one or more vias in the dielectric layer overlying the bottom contact pad. The lower portion of photosensor island 120, i.e., the portion closest to substrate 105 (for ease of description, "lower" and "bottom" are used interchangeably and "upper" and "top" are used interchangeably to refer to portions of the photodiode with respect to their proximity to the substrate as illustrated in the FIGURE; no operational or functional limitation on the orientation of the device is implied) may extend beyond bottom contact pad 110, or may alternatively be disposed on substrate 105 completely within the borders of bottom contact pad 110. Alternatively, a layer of dielectric material (not shown) may be disposed over substrate 105 and bottom contact pad 110, except for an opening to make electrical contact between photosensor island 120 and bottom contact pad 110. Photosensor island 120 is typically mesa-shaped, having sidewalls 122 sloping upwardly and inwardly from substrate 105 towards an upper surface 124 which is relatively flat.

Photosensor island 120 advantageously comprises substantially intrinsic hydrogenated amorphous silicon (referred to herein as amorphous silicon or a-Si) or combinations of a-Si and other materials, for example a-Si carbide or a-Si germanium (respectively, a-$Si_xC_{1-x}$ or a-$Si_xGe_{1-x}$, where $0 < x \leq 1$). Photosensor island 120 typically has relatively thin bands of a n-type doped region 121 and p-type doped region 123 at the bottom and top, respectively, of the island structure to enhance electrical contact with the adjoining electrode (the relative location of the p or n doped areas can vary based upon the biasing of the photodiode). The thickness of the photosensor island is typically between about 0.1 micron and 2 microns, although in some arrangements the thickness may be 10 microns or greater. Amorphous silicon is typically deposited by plasma enhanced chemical vapor deposition (PECVD) or similar methods and then patterned, for example by etching, to form the desired island structure.

In accordance with this invention, passivation layer 130 comprises an inorganic moisture barrier layer 132 and an organic dielectric layer 134. Moisture barrier layer 132 extends at least over sidewalls 122 of photosensor island 120, and typically additionally extends over portions of substrate 105 and portions of top surface 124, as illustrated in the FIGURE. Moisture barrier layer 132 comprises inorganic dielectric materials, preferably silicon nitride. The structure of moisture barrier layer 132 is selected to adhere well to sidewalls 122 and have high structural integrity; the thickness of the moisture barrier layer is preferably between about 0.01 micron and 0.5 micron. Silicon nitride comprising the moisture barrier layer typically has an optical index between about 1.82 and about 1.86. The moisture barrier layer is typically formed by the deposition of the inorganic dielectric material, for example by PECVD, and subsequent etching to remove barrier layer 132 at least from a portion of top surface 124 of photosensor island 120. Such a deposition process generally does not require temperatures in excess of about 250° C., thus causing minimal degradation of the underlying a-Si. Further, as this inorganic dielectric material layer is relatively thin, it is not prone to crack or experience significant stress such that its structural integrity is degraded.

The inorganic dielectric material bonds well to the a-Si in the photosensor island and forms a barrier that is highly resistant to penetration by moisture. This protection is of particular importance on sidewalls 122, which otherwise present restively large surfaces that are subject to degradation from exposure to moisture over time and can become the source of considerable charge leakage from the device. The effectiveness of moisture barrier layer 132 is enhanced when the layer extends over the corners forming the intersection between island sidewalls 122 and island top surface 124.

Organic dielectric layer 134 is disposed over substrate 105 and inorganic moisture barrier layer 132. Dielectric layer 134 typically further extends over top surface 124 of photosensor island 120 except for a selected contract area 126. As illustrated in the FIGURE, organic dielectric layer 134 typically extends beyond the boundaries of underlying moisture barrier layer 132 on photosensor island top surface 124. Such a structure enables use of different etch steps for inorganic dielectric layer 124 and organic dielectric layer 134, and further allows for readily reproducible fabrication steps to produce the desired geometry of the inorganic dielectric layer to allow formation of a high integrity top contact layer 140 thereover. Alternatively, the organic dielectric layer may be coextensive (i.e., having the same boundaries on top surface 124) with the underlying moisture barrier layer 132. It is desirable that the top surfaces of organic dielectric layer 134 be reasonably smooth so that top contact layer 140 deposited thereover will be of high integrity. Organic dielectric layer 134 also advantageously has some planarizing effect, limiting step coverage problems for the underlying top contact layer 140.

Organic dielectric layer 134 typically comprises a polyimide (and preferably a preimidized polyimide, such as the Ciba-Geigy ® 200 series). The organic dielectric is deposited, for example by spin coating, to a thickness of between about 0.5 micron and 2.5 microns; the thickness is selected to provide the desirable passivation layer characteristics (except for the moisture resistance) noted above, including providing sufficient separation between top contact layer 140 to limit the capacitance between top contact layer and underlying address lines, including bottom contact layer 110.

Top contact layer 140 is disposed over organic dielectric layer 134 and is in electrical contact with photosensor island 120 at selected contact area 126. Top contact layer 140 comprises a substantially transparent electrically conductive material such as indium tin oxide (ITO), and forms the electrical contact between the photodiode and other elements used in reading and processing of charge generated by the photodiode in response to incident radiation. This electrically conductive material is deposited, for example by sputtering, and patterned to form the desired contacts. Top contact layer 140 genially has a thickness between about 0.05 micron and 0.3 micron. Thus, in the finished device, passivation layer 130 is disposed between top contact layer 140 and photosensitive island 120 or substrate 105, except in selected contact area 126 on top surface 124 of photosensor island 120.

In operation, incident radiation 102 enters photosensor island 120 after passing through one or all of the substantially optically transparent top contact layer 140, organic dielectric layer 134, and moisture barrier layer 132. Radiation absorbed by the a-Si in the photosensor island results in the generation of charge, which is collected at the contacts. The dual layer passivation layer, in accordance with this invention, minimizes sidewall leakage from the photodiode. The inorganic moisture barrier adjoins the sidewalls and limits moisture penetration to those sidewalls as compared with a polyimide-only passivation layer. As the moisture barrier is relatively thin, it is not as susceptible to cracks, pinholes, and stress as would be an inorganic dielectric-only passivation layer, which would necessarily be quite thick (e.g., about 1 micron or more). The dual layer passivation layer further protects the a-Si photosensor island from leakage resulting from the combination of moisture and ionic impurities present in most polyimides with adjoining a-Si photodiode sidewalls, while still enabling the use of polyimide to take advantage of its numerous attributes, such as the ability to deposit it in a relative thick amount without resulting cracks and stresses.

The advantages of this invention are especially applicable to all photosensitive elements in which sidewall leakage is of concern to device performance. Sidewall leakage is of particular importance as photodiode sizes decrease to less than about 1 $mm^2$, since sidewall leakage then becomes a significant contributor to the total reverse bias leakage of the photodiode. Particularly for photodiodes having a size of less than about 200 microns on a side, sidewall leakage dominates the area leakage component and is thus of primary importance to this aspect of device performance. The moisture barrier provided by this invention similarly benefits larger photodiodes in which humidity related degradation of sidewalls can cause sidewall leakage to become a significant leakage contributor.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A photosensitive element comprising:
   a substrate;
   a bottom contact pad disposed on said substrate;
   a photosensor island disposed on said substrate in electrical contact with said bottom contact pad and comprising a photosensitive material, said photosensor island having sidewalls extending upwardly from said substrate to an upper surface disposed between said sidewalls;
   a top contact layer disposed over said photosensor island and in electrical contact with a selected contact area on said photosensor island; and
   a passivation layer disposed between said top contact layer and said photosensor island except in said selected contact area, said passivation layer comprising:
   an inorganic moisture barrier layer extending at least over said photosensor island sidewalls; and
   an organic dielectric layer.

2. The photosensitive element of claim 1 wherein said inorganic moisture barrier layer comprises silicon nitride.

3. The photosensitive element of claim 2 wherein said organic dielectric layer comprises a polyimide.

4. The photosensitive element of claim 3 wherein said inorganic moisture barrier layer further extends over at least a portion of said substrate and a portion of said photosensor island top surface.

5. The photosensitive element of claim 3 wherein said inorganic moisture barrier layer further extends over at least the portion of said photosensor island top surface adjoining said sidewalls.

6. The photosensitive element of claim 3 wherein the thickness of said inorganic moisture barrier layer is between about 0.01 micron and 0.5 microns.

7. The photosensitive element of claim 6 wherein the thickness of said organic dielectric layer is between about 0.5 to 2.5 microns.

8. The photosensitive element of claim 3 wherein the thickness of said organic dielectric layer is between about 0.5 to 2.5 microns.

9. The photosensitive element of claim 3 wherein said photosensor island comprises substantially intrinsic hydrogenated amorphous silicon (a-Si).

10. The photosensitive element of claim 3 wherein said photosensor island comprises a material selected from the group of a-Si carbide and a-Si germanium, said materials respectively having the composition of a-$Si_xC_{1-x}$ and a-$Si_xGe_{1-x}$, wherein $0 < x \leq 1$.

* * * * *

UNITED STATES PATENT AND TRADEMARK OFFICE
CERTIFICATE OF CORRECTION

PATENT NO. : 5,233,181
DATED : August 3, 1993
INVENTOR(S) : Robert F. Kwasnick, et. al.

It is certified that error appears in the above-indentified patent and that said Letters Patent is hereby corrected as shown below:

Title page, item [75], inventors: should be-- Robert F. Kwasnick--.

Signed and Sealed this

Twelfth Day of March, 1996

Attest:

BRUCE LEHMAN

*Attesting Officer*     *Commissioner of Patents and Trademarks*